(12) United States Patent
Chen et al.

(10) Patent No.: US 9,646,859 B2
(45) Date of Patent: May 9, 2017

(54) DISK-BRUSH CLEANER MODULE WITH FLUID JET

(75) Inventors: Hui Chen, Burlingame, CA (US); Allen L. D'Ambra, Burlingame, CA (US); Sen-Hou Ko, Sunnyvale, CA (US); Yufei Chen, Cupertino, CA (US); Adrian Blank, Gilroy, CA (US); Mario D. Silvetti, Morgan Hill, CA (US); Gerald J. Alonzo, Los Gatos, CA (US); Lakshmanan Karuppiah, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 1844 days.

(21) Appl. No.: 12/771,969

(22) Filed: Apr. 30, 2010

(65) Prior Publication Data

US 2011/0265816 A1 Nov. 3, 2011

(51) Int. Cl.
*H01L 21/67* (2006.01)

(52) U.S. Cl.
CPC .. *H01L 21/67046* (2013.01); *H01L 21/67051* (2013.01)

(58) Field of Classification Search
CPC ......... H01L 21/67046; H01L 21/67051; H01L 21/67028; H01L 21/02087; H01L 21/02096; H01L 21/67057; H01L 21/67253
USPC ........ 15/77, 88.2, 88.3, 102; 451/41, 63, 65, 451/66, 67
See application file for complete search history.

(56) References Cited

U.S. PATENT DOCUMENTS

| | | | |
|---|---|---|---|
| 5,282,289 A * | 2/1994 | Hasegawa et al. | 15/21.1 |
| 5,685,039 A * | 11/1997 | Hamada et al. | 15/88.2 |
| 6,053,977 A | 4/2000 | Konishi | |
| 6,119,708 A | 9/2000 | Fishkin et al. | |
| 6,299,698 B1 | 10/2001 | Emami et al. | |
| 6,516,816 B1 | 2/2003 | Husain et al. | |
| 6,616,509 B1 * | 9/2003 | Frost et al. | 451/41 |
| 6,986,185 B2 | 1/2006 | Sugarman et al. | |
| 7,229,504 B2 | 6/2007 | Sugarman et al. | |
| 2002/0059686 A1 * | 5/2002 | Uemukai et al. | 15/77 |
| 2002/0092121 A1 * | 7/2002 | Momonoi et al. | 15/345 |

(Continued)

FOREIGN PATENT DOCUMENTS

| | | |
|---|---|---|
| CN | 1685080 A | 10/2005 |
| CN | 1755911 A | 4/2006 |

(Continued)

OTHER PUBLICATIONS

International Search Report and Written Opinion Dated Sep. 26, 2011 for International Application No. PCT/US2011/021147.

(Continued)

*Primary Examiner* — Robert Scruggs
(74) *Attorney, Agent, or Firm* — Patterson + Sheridan, LLP (57) ABSTRACT

Embodiments of the present invention relates to an apparatus and method for cleaning a substrate using a disk brush. One embodiment provides a substrate cleaner comprising a substrate chuck disposed in the processing volume, and a brush assembly disposed in the processing volume, wherein the brush assembly comprises a disk brush movably disposed opposing the substrate chuck, and a processing surface of the disk brush contacts a surface of the substrate on the substrate chuck.

19 Claims, 9 Drawing Sheets

(56) References Cited

U.S. PATENT DOCUMENTS

| | | |
|---|---|---|
| 2002/0162181 A1 | 11/2002 | Krupa et al. |
| 2003/0200988 A1 | 10/2003 | Brown et al. |
| 2005/0072358 A1 | 4/2005 | Katsuoka et al. |
| 2005/0103364 A1 | 5/2005 | Kamikawa |
| 2005/0109371 A1 | 5/2005 | Sin et al. |
| 2005/0211276 A1 | 9/2005 | Yudovsky et al. |
| 2005/0268937 A1 | 12/2005 | Sugarman |
| 2007/0175501 A1* | 8/2007 | Amai et al. ............. 134/149 |
| 2007/0209135 A1 | 9/2007 | Chen et al. |
| 2007/0221249 A1 | 9/2007 | Sugarman et al. |
| 2009/0126760 A1* | 5/2009 | Banerjee et al. ............ 134/1 |
| 2010/0078041 A1 | 4/2010 | Chen et al. |
| 2010/0099342 A1* | 4/2010 | Chen et al. ............. 451/494 |
| 2011/0094537 A1* | 4/2011 | Ko et al. ............... 134/6 |

FOREIGN PATENT DOCUMENTS

| | | |
|---|---|---|
| CN | 1965395 A | 5/2007 |
| JP | H08-31783 A | 2/1996 |
| JP | 08-309297 A | 11/1996 |
| JP | 11-330032 | 11/1999 |
| JP | 2000-183020 A | 6/2000 |
| JP | 2002-066466 A | 3/2002 |
| JP | 2002151454 A | 5/2002 |
| JP | 2002-313765 A | 10/2002 |
| TW | 384505 B | 3/2000 |
| WO | 2010/039409 A2 | 4/2010 |

OTHER PUBLICATIONS

Chinese Office Action dated Sep. 18, 2015 for Application No. 201180007442.3.

Japanese Office Action (with attached English translation of the Concise Summary of Reasons for Rejection) for Application No. 2013-507953 dated Jan. 16, 2015; 4 total pages.

Taiwanese Office Action (with attached English translation) for Application No. 100104317 dated May 18, 2015; 13 total pages.

Chinese Office Action (with attached English translation) for Application No. 201180007442.3 dated Jan. 26, 2015; 14 total pages.

* cited by examiner

DISK-BRUSH CLEANER MODULE WITH FLUID JET

BACKGROUND OF THE INVENTION

Field of the Invention

Embodiments of the present invention generally relate to an apparatus and a method for processing semiconductor substrates. More particularly, embodiments of the present invention provide apparatus and method for cleaning semiconductor substrates with a disk brush.

Description of the Related Art

During fabrication of a semiconductor device, various layers, such as oxides, copper, require planarization to remove steps or undulations prior to formation of subsequent layers. Planarization is typically performed mechanically, chemically, and/or electrically by pressing a device side of a semiconductor substrate against a polishing pad which is saturated with a polishing solution, such as an abrasive compound, and by rotating the polishing pad relative to the semiconductor substrate.

The planarization process is usually followed by a cleaning process which removes residual polishing solutions and/or particles from polishing. Conventional cleaning processes generally include scrubbing the substrate surfaces with mechanical scrubbing devices using brushes made from porous or sponge like materials, such as polyvinyl acetate (PVA), or brushes made with nylon bristles. However, conventional brush cleaners have limited control over motion and down force of the scrubber brush and the rotation speed of the substrate, thus, with a limited throughput and potential of damaging the substrate during cleaning.

Therefore, there is a need for apparatus and method for cleaning a substrate.

SUMMARY OF THE INVENTION

The present invention generally relates to a method and apparatus for cleaning a substrate after a polishing process. Particularly, embodiments of the present invention relates to an apparatus and method for cleaning a substrate using a disk brush while rotating the substrate using a chuck.

One embodiment provides a substrate cleaner comprising a chamber body defining a processing volume, wherein the chamber body has a top opening configured to allow passage of a substrate, a substrate chuck disposed in the processing volume, wherein the substrate chuck is configured to receive a substrate and rotate the substrate in a substantially vertical orientation, and a brush assembly disposed in the processing volume, wherein the brush assembly comprises a disk brush movably disposed opposing the substrate chuck, wherein a processing surface of the disk brush contacts a surface of the substrate on the substrate chuck.

Another embodiment provides a substrate cleaner comprising a tank having an upper opening and an inner volume for accommodating a substrate in a substantially vertical direction, a vacuum chuck disposed in the inner volume, wherein the vacuum chuck is configured to receive and rotate a substrate in a substantially vertical orientation, a substrate handler disposed in a lower portion of the inner volume, wherein the substrate handler is configured to transfer a substrate between the vacuum chuck and an exterior robot, and a brush assembly. The brush assembly comprises a disk brush movably disposed in the inner volume opposing the substrate chuck, a sliding mechanism configured to slide the disk brush parallel to the vacuum chuck between a central region of the vacuum chuck and an edge region of the vacuum chuck, a spray nozzle coupled to the sliding mechanism near the disk brush, wherein the spray nozzle directs a processing fluid towards a substrate on the vacuum chuck and the disk brush, a rotating motor configured to rotate the disk brush, and a cylinder configured to move the disk brush towards and away from the vacuum chuck.

Yet another embodiment provides a method for processing a substrate, comprising transferring the substrate in a vertical orientation to a processing volume of a cleaning chamber, securing the substrate on a substrate chuck disposed in the cleaning chamber, rotating the substrate in a substantially vertical orientation using the substrate chuck, contacting the substrate with a disk brush disposed in the cleaning chamber, and cleaning the substrate comprising pressing and rotating the disk brush against the substrate while sliding the disk brush from a center to an edge of the substrate.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Embodiments of the present invention generally relate to an apparatus and a method for cleaning a semiconductor substrate after a polishing process. Particularly, embodiments of the present invention relates to an apparatus and method for cleaning a substrate using a disk brush while rotating the substrate vertically using a vacuum chuck.

Embodiments of the present invention relate to using a rotating disk brush against a substrate rotated by a vacuum chuck for cleaning process. Advantages of embodiments of the present invention include improving throughput, avoiding deformation, and reducing defect near the edge region of the substrate.

Because a substrate can be rotated at a much higher speed using a substrate chuck than using rollers, cleaning throughput can be greatly increased using the embodiments of the present invention. The disk brush of the present invention is also easier to control than scrubber brushes used in the traditional brush box cleaner.

Using a substrate chuck to hold a substrate during process also provides support to the substrate from a backside of the substrate. As a result, the substrate remains flat during cleaning, therefore, is unlikely to deform.

Because the substrate chuck does not need to contact the edge region of the substrate, embodiments of the present invention allow the disk brush to access and clean the entire surface of the substrate including the edge of the substrate. Therefore, defects near the edge regions are reduced.

Additionally, the increased substrate rotational rate also improves electronic charge condition on the substrate being cleaned. Embodiments of the present invention also provide fluid jet nozzles to direct atomized cleaning solution towards the substrate being cleaned, thus, further improve the charge condition on the substrate.

Embodiments of cleaning modules may be adapted to benefit from the invention is a DESCIA® cleaner and a REFLEXION GT® cleaner, both available from Applied Materials, Inc., located in Santa Clara, Calif.

Figure 1:
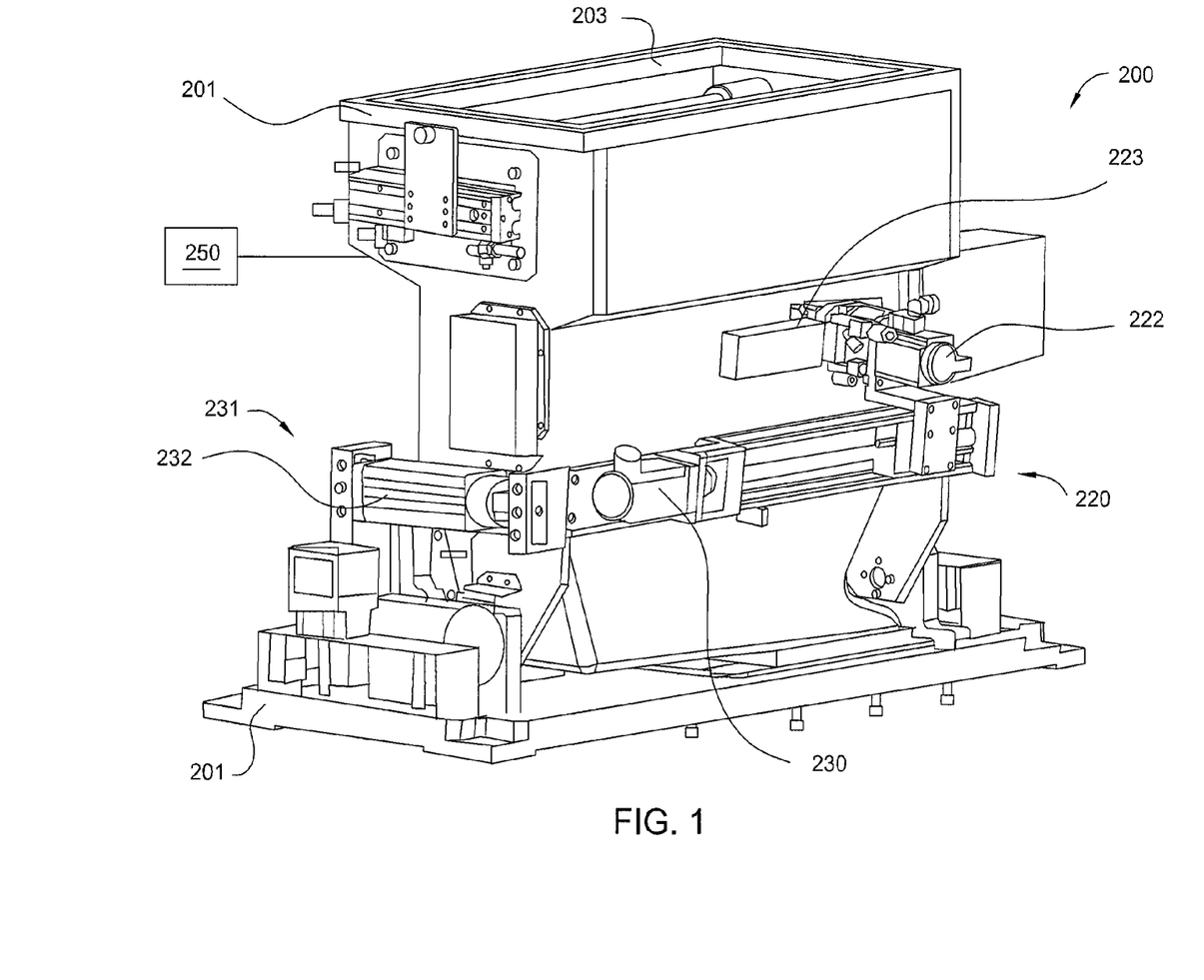
FIG. 1 is a schematic perspective front view of a cleaner module in accordance with one embodiment of the present invention.
Figure 2:
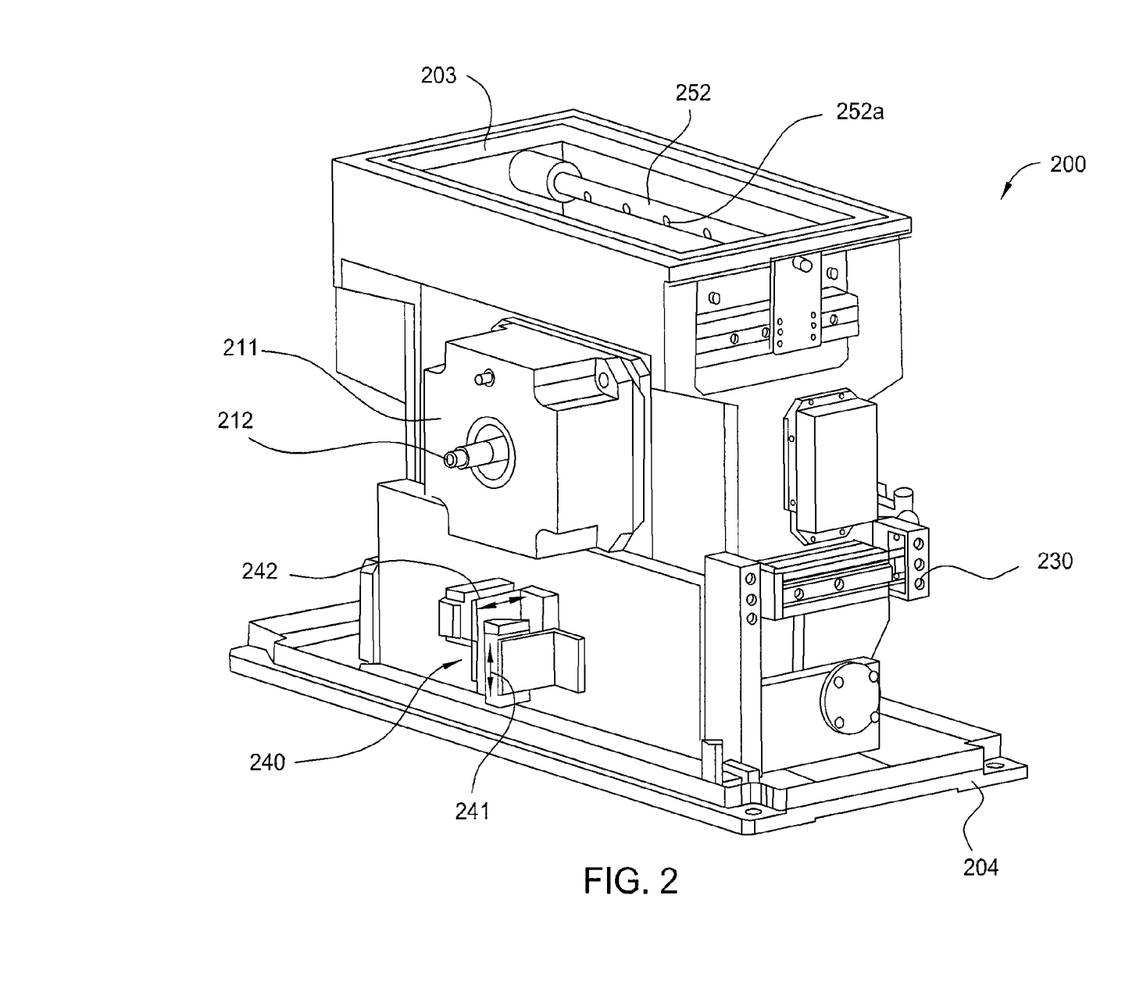
FIG. 2 is a schematic perspective back view of the cleaner module of FIG. 1.
Figure 3:
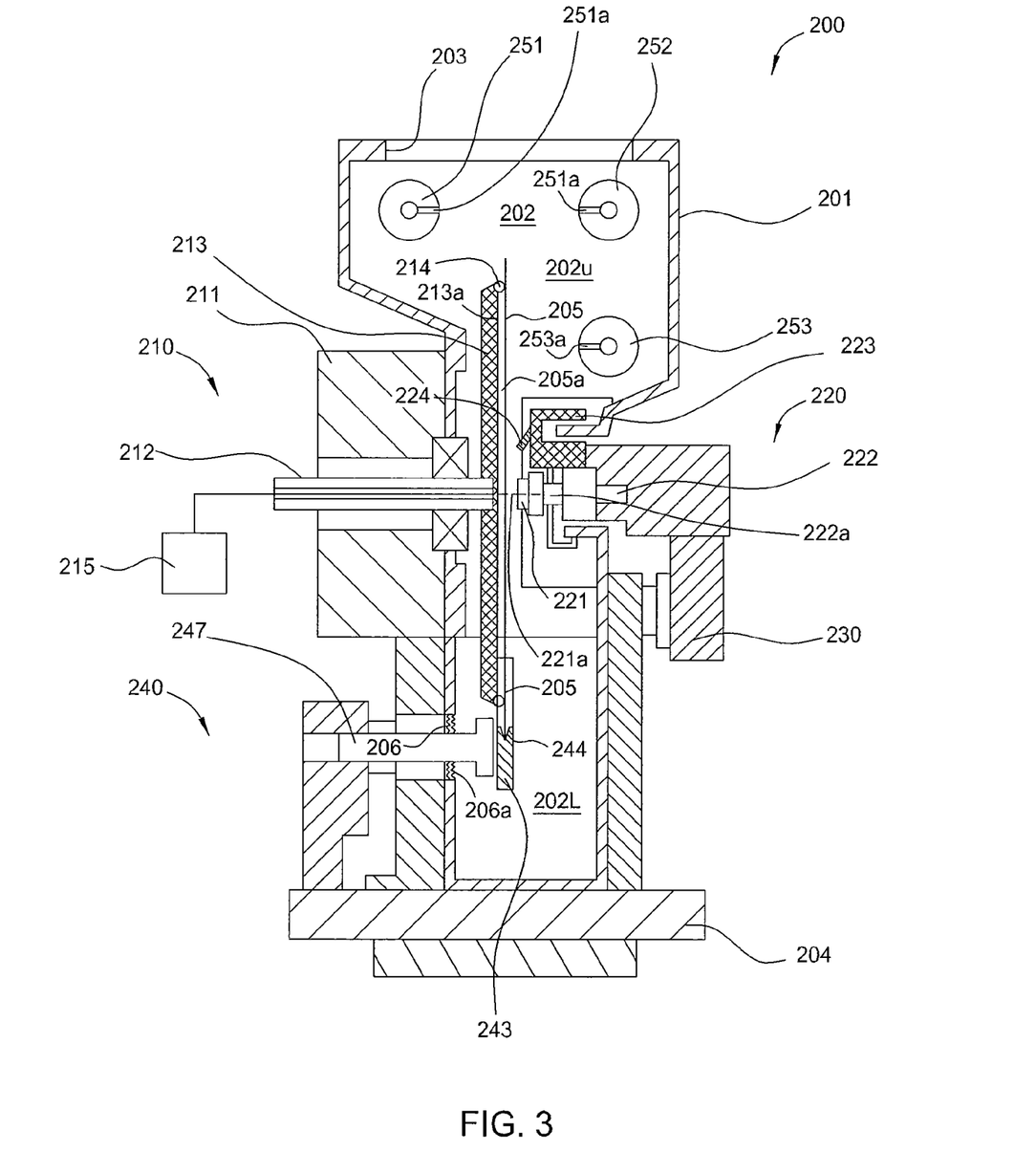
FIG. 3 is a schematic sectional side view of the cleaner module of FIG. 1.
Figure 4:
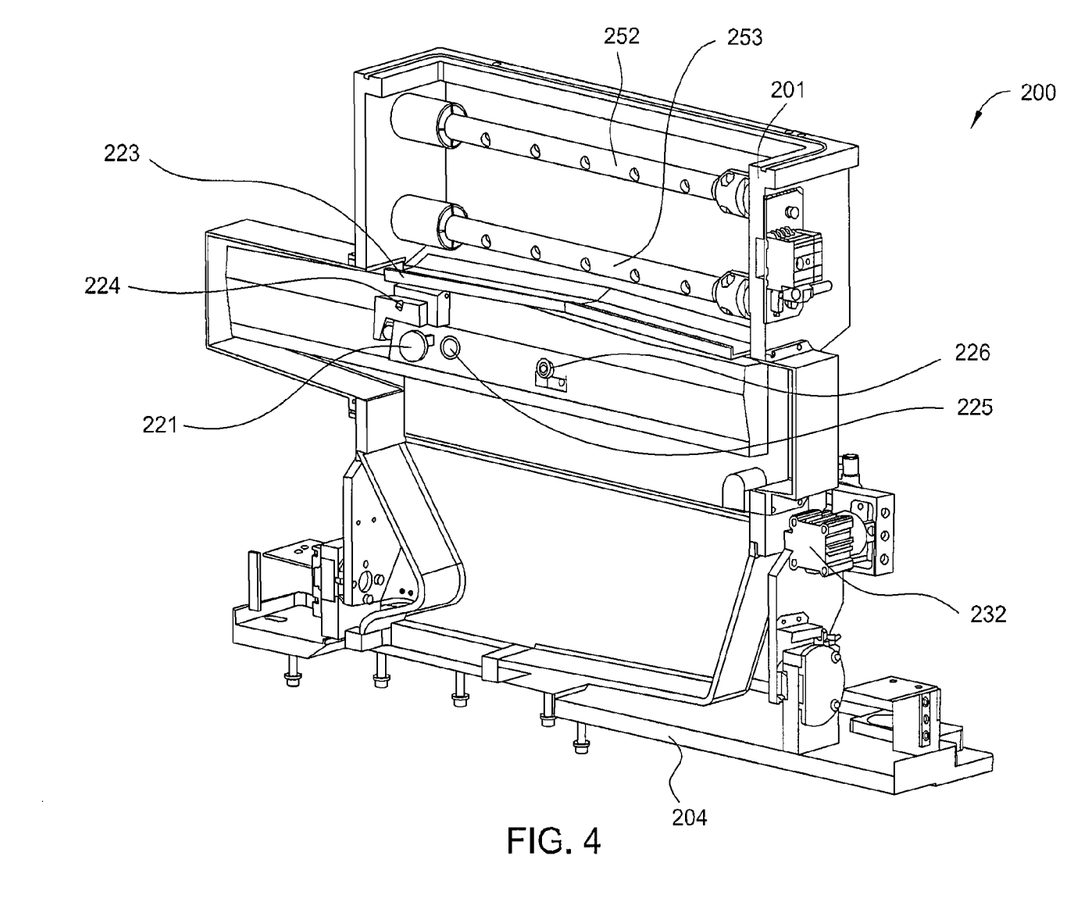
FIG. 4 is a schematic sectional view of the cleaner module of FIG. 1 showing the disk brush and fluid jets.

FIGS. 1-4 schematically illustrate a cleaner module 200 in accordance with one embodiment of the present invention. FIG. 1 is a schematic perspective front view of the cleaner module 200 showing the disk brush assembly. FIG. 2 is a schematic perspective back view of the cleaner module 200 showing the motor for a substrate chuck and a driving mechanism for a substrate handler. FIG. 3 is a schematic sectional side view of the cleaner module 200. FIG. 4 is a schematic sectional view of the cleaner module 200.

The cleaner module 200 is configured to clean a substrate in a substantially vertical orientation. The cleaner module 200 comprises a tank 201 defining an inner volume 202 configured to accommodate and clean a substrate 205 in a substantially vertical orientation. The tank 201 is generally secured to a base 204. The tank 201 has an upper opening 203 to allow passage of substrates and exterior substrate handlers, such as an exterior robot. In one embodiment, the tank 201 may comprise a lid that can be removably disposed over the upper opening 203 during processing.

In one embodiment, the cleaner module 200 comprises a substrate handler 240, a substrate chuck assembly 210, and a disk brush assembly 220. The substrate handler 240 is configured to transfer substrates between exterior substrate handlers and the substrate chuck assembly 210. The substrate chuck assembly 210 is configured to secure and rotate a substrate in a substantially vertical position in the inner volume 202 of the tank 201. The disk brush assembly 220 is configured to press a disk brush 221 against the rotating substrate 205 on the substrate chuck assembly 210 to clean the substrate 205.

In one embodiment, the substrate chuck assembly 210 comprises a substrate support 213 disposed in the inner volume 202 of the tank 201 for securing a substrate in a substantially vertical position. The substrate support 213 is coupled to a shaft 212 of a motor 211 configured to rotate the substrate support 213. The motor 211 is disposed outside the tank 201 with the shaft 212 extending through a sidewall of the tank 201. The motor 211 may be able to rotate the substrate support 213 up to about 2000 RPM (rotation per minute). In one embodiment, the motor 211 may rotate the substrate support 213 and the substrate 205 thereon between about 100 RPM to about 400 RPM during cleaning. In one embodiment, the motor 211 is a hollow shaft motor.

In one embodiment, the substrate support 213 is a vacuum chuck configured to secure the substrate 205 by vacuum chucking a back side of the substrate 205. In one embodiment, the substrate support 213 comprises a lip 214 attached to an upper surface 213a of the substrate support 213 around an edge region. The lip 214 is configured to contact the backside of the substrate 205 and form a pocket 205a between the backside of the substrate 205 and the upper surface 213a of the substrate support 213. A vacuum source 215 is fluidly connected to the pocket 205a. During operation, the vacuum source 215 can pump the pocket 205a and form a low pressure region therein to enable vacuum chuck.

Figure 7:
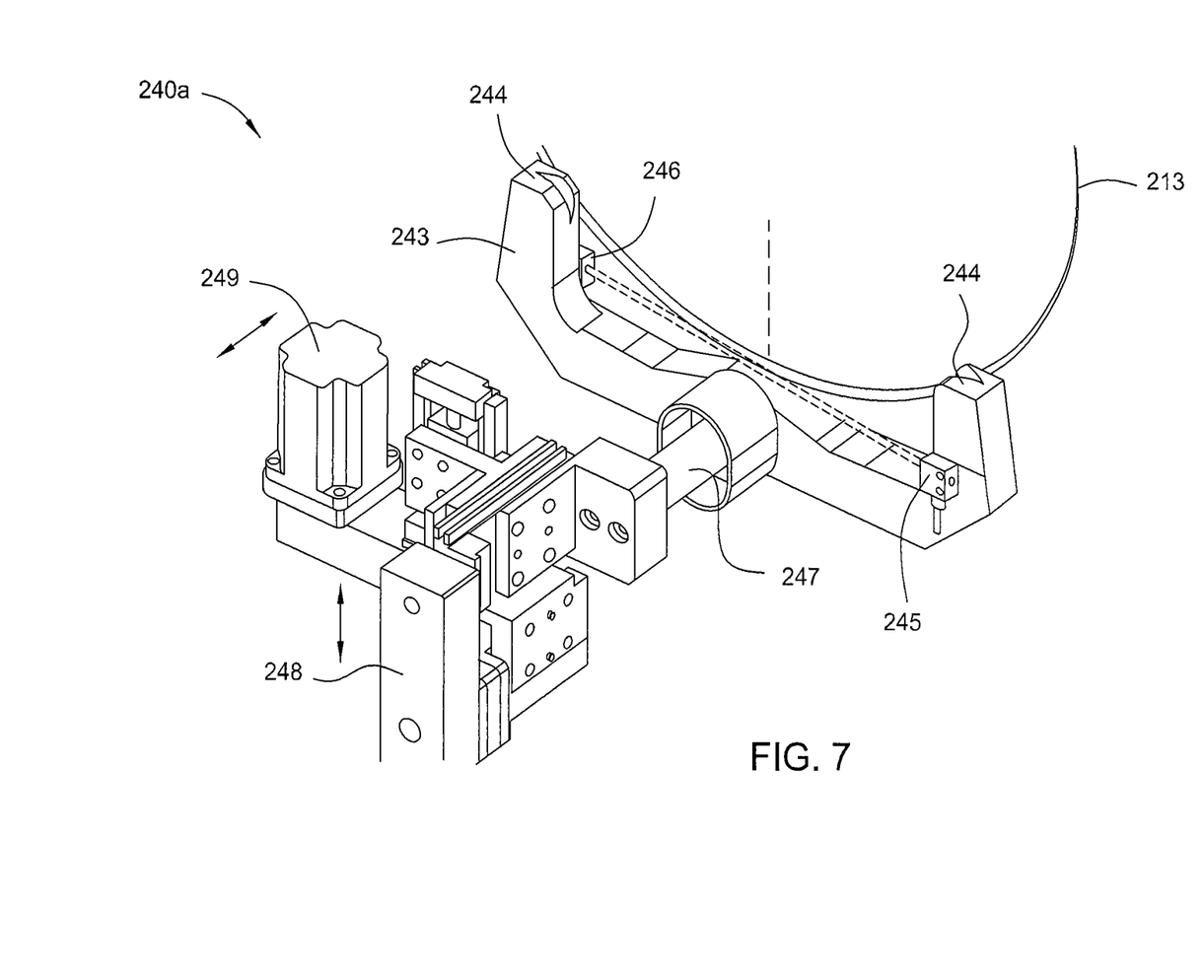
FIG. 7 is a schematic perspective view of a substrate holder in accordance with another embodiment of the present invention.

The substrate handler 240 comprises an end effector 243 disposed in a lower portion 202L of the inner volume 202. The end effector 243 is configured to receive and transfer a substrate by an edge region. A schematic perspective view of the end effector 243 is shown in FIG. 7. In one embodiment, the end effector 243 has two or more notches 244 formed thereon for receiving an edge of the substrate 205. In one embodiment, the end effector 243 comprises a sensor assembly configured to detect the presence of a substrate. In one embodiment, a light source 245 and an optical sensor 246 are disposed on opposite sides of the end effector 243 so that a substrate in the end effector 243 blocks the path between the light source 245 and the optical sensor 246.

Referring back to FIG. 2, the substrate handler 240 comprises a vertical motion assembly 241 and a horizontal motion assembly 242 connected to the end effector 243 via a shaft 247. The vertical motion assembly 241 and the horizontal motion assembly 242 are disposed outside the tank 201. The shaft 247 extends through an opening 206a in the sidewall of a tank 201 to connect the motion assemblies 241, 242 with the end effector 243. A flexible seal 206 may be used to seal the opening 206a around the shaft 247 to allow vertical and horizontal motions of the shaft 247.

During operation, the horizontal and vertical motion assembly 242, 241 position the end effector 243 in an exchange position to receive a substrate from an exterior substrate handler that delivers a substrate vertically from the upper opening 203 of the tank 201. The end effector 243 receives the substrate in the notches 244 and the exterior substrate handler retrieves out of the tank 201. The end effector 243 is then moved up and back to a loading position wherein the substrate is positioned against the lip 214 of the substrate support 213. The substrate is then vacuum chucked to the substrate support 213. The end effector 243 then moves vertically and horizontally to clear away so that the substrate support 213 can freely rotate the substrate. After the substrate is cleaned, the end effector 243 is moved to the loading position to retrieve the substrate from the substrate support 213. After retrieving the substrate from the substrate support 213, the end effector 243 is moved to the exchanging position handing the substrate to the exterior substrate handler and then waits for a new substrate from the exterior substrate handler.

In one embodiment, the vertical motion assembly 241 and the horizontal motion assembly 242 are linear cylinders each configured to move between two points. The linear cylinders can be pneumatically controlled thus with relatively low costs. In another embodiment, as shown in FIG. 7, motors 248, 249 are used to control the vertical and horizontal motions of the end effector 243 respectively. The motors 248 and 249 allow the end effector 243 having multiple positions during operation, and calibration during setup. In another embodiment, the substrate handler 240a may use the combination of a linear cylinder and a motor to control the vertical and horizontal motions of the end effector 243.

The disk brush assembly 220 is configured to clean the rotating substrate 205 on the substrate support 213 using a disk brush 221, which has a top surface 221a substantially parallel to the substrate 205. The top surface 221a may be a planar surface configured for cleaning the substrate by scrubbing with gentle pressure.

In one embodiment, the disk brush 221 is fabricated from soft material chemically compatible with the cleaning solution. In one embodiment, the disk brush 221 is fabricated from PVA (polyvinyl alcohol) or similar material. In one embodiment the disk brush 221 has a softness that allows the thickness to reduce by 30% under a pressure between about 62 gm/cm$^2$ to about 84 gm/cm$^2$. The disk brush 221 may also have a porosity value between about 85% to about 95%.

In one embodiment, the disk brush 221 may be circular or oval in shape. The top surface 221a may have an outer diameter of between about 20 mm to about 31 mm. The disk brush 221 may have thickness of about 15 mm to about 25 mm.

FIG. 4 shows a front view of the disk brush assembly 220 from the point of view of the substrate support 213. Beside the disk brush 221, the disk brush assembly 220 further comprises a spray nozzle 224 disposed near the disk brush 221, a first fluid jet 225 disposed near the disk brush 221, and a second fluid jet 226 positioned away from the disk brush 221 at a distance about a radius of the substrate support 213 or a radius of the substrate 205 being processed. The disk brush 221, the spray nozzle 224, and the fluid jets 225, 226 are coupled to a sliding block 223 that moves the disk brush 221 parallel to the substrate support 213 from near a center of the substrate support 213 to an edge of the substrate support 213. The spray nozzle 224 and the fluid jets 225, 226 move with the disk brush 221.

In one embodiment, the spray nozzle 224 is configured to spray a fluid flow having a cone-shaped coverage. The spray nozzle 224 is positioned so that the cone shaped fluid flow reaches both the top surface 221a of the disk brush 221 and the substrate 205 when the disk brush 221 contacts the substrate 205 on the substrate support 213. During cleaning, the spray nozzle 224 is configured to spray a processing fluid to the substrate 205 in a region upstream to the disk brush 221 so that the substrate 205 is wet when the disk brush 221 reaches the region. The spray nozzle 224 also cleans the disk brush 221 when the disk brush 221 is in contact with the substrate 205. When the disk brush 221 is configured to clean the substrate 205 while moving radially outwards, the spray nozzle 224 is positioned radially outward of the disk brush 221.

The fluid jets 225, 226 are configured to independently direct atomized fluid flow toward the substrate 205 during processing. In one embodiment, the fluid jets 225, 226 are each connected to a source of processing fluid and a source of pressurized air to deliver atomized fluid flows. In one embodiment, the processing fluid and the pressurized air may have similar pressure level of up to about 45 psi. In one embodiment, the processing fluid and the air mixture may be delivered at about 20 to about 100 milliliter per minute. The fluid jets 225, 226 are disposed away from each other at a distance about a radius of the substrate being processed so that atomized fluid flow can be provided to the substrate from center to edge when the sliding block 223 is moving radially inward and radially outward. An exemplary sequence will be discussed in association with FIGS. 5A-5E. The fluid jets 225, 226 enhance charge on the substrate being processed, particularly when the rotational rate is low.

The disk brush 221 is coupled to a disk brush motor 222 configured to rotate the disk brush 221 about its center axis. The disk brush motor 222 is disposed outside the tank 201 and coupled to the disk brush 221 via a shaft 222a which passes through the tank 201. The rotation of the disk brush 221 provides additional relative motion between the substrate 205 and the disk brush 221, thus enhancing the cleaning process during processing. In one embodiment, the disk brush 221 may rotate between about 100 RPM to about 400 RPM.

The disk brush assembly 220 further comprises a sliding mechanism 230 configured to move the sliding block 223 along with the disk brush 221, the disk brush motor 222, the spray nozzle 224, and the fluid jets 225, 226 back and forth within the tank 201. In one embodiment, the sliding mechanism 230 may include a motor coupled to a linear drive unit which drives the sliding block 223.

The disk brush assembly 220 further comprises a brush depth control assembly 231 configured to adjust the distance between the substrate 205 and the top surface 221a of the disk brush 221, and to apply a force against the substrate 205 through the disk brush 221. In one embodiment, the brush depth control assembly 231 comprises a cylinder 232 connected with the disk brush 221 via the sliding mechanism 230 and the sliding block 223. The cylinder 232 is configured to move the disk brush 221, the sliding mechanism and the sliding block 223 horizontally to adjust the distance between the substrate 205 and the disk brush 221.

In one embodiment, the cylinder 232 is connected to a controller 250 which is configured to control the force applied to the substrate 205 by the disk brush 221. When the cylinder 232 drives the disk brush 221 towards the substrate support 213 to contact the substrate 205, the controller 250 monitors pressure of a regulator of the cylinder 232 and stops the cylinder 232 when the pressure of the regulator reaches a determined the value. In one embodiment, the force applied to the substrate 205 from the disk brush 221 is between about 0.1 lb to about 2.0 lb.

Figure 6:
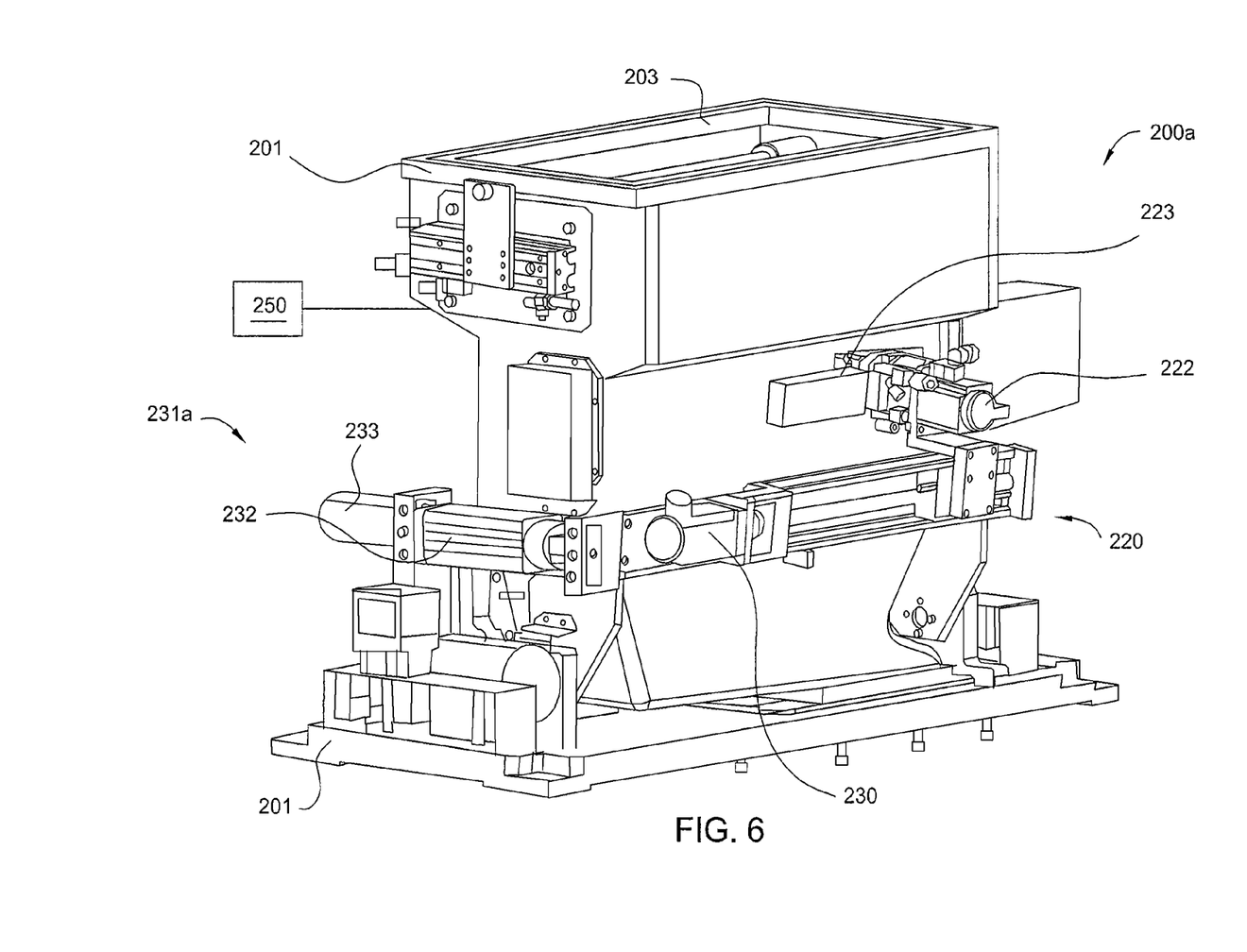
FIG. 6 is a schematic perspective front view of a cleaner module in accordance with another embodiment of the present invention.

FIG. 6 is a schematic perspective front view of a cleaner module 200a in accordance with another embodiment of the present invention. The cleaner module 200a is similar to the cleaner module 200 except that the cleaner module 200a comprises different brush depth control assembly 231a. The brush depth control assembly 231a comprises a cylinder 232 and a motor 233 connected with the disk brush 221 via the sliding mechanism 230 and the sliding block 223. Both the cylinder 232 and the motor 233 are configured to move the disk brush 221 towards the substrate support 213 and the substrate 205. The controller 250 is connected to the cylinder 232 and the motor 233 to control the distance between the disk brush 221 and the substrate 205.

During operation, the motor 233 first drives the disk brush 221 toward the substrate 205 alone, and the controller 250 monitors a torque of the motor 233. As soon as the disk brush 221 contacts the substrate 205, the obstacle of moving the disk brush 221 increases, hence the torque of the motor 233 also increases. Accordingly, the controller 250 can determine when the disk brush 221 contacts the substrate 205 by watching for a drastic increase in the torque of the motor 233. When an increase of the torque is observed, such as the torque increases by about 25%, the controller 250 stops the motor 233 and marks a hot-stop for the cylinder 232 at the location where the increase of torque is detected. The motor 233 then moves the disk brush 221 back away from the substrate 205 to a standby location. The cylinder 232 then moves between a standby location (the disk brush 221 does not contact the substrate 205) and the hot-stop (the disk brush 221 contacts the substrate 205) during the process of cleaning the substrate 205.

By using an extra motor 233, the brush depth control assembly 231*a* increases accuracy and repeatability in the control of the relative position between the disk brush 221 and the substrate being processed.

Referring back to FIG. 3, the cleaner module 200 further comprises two or more spray bars disposed in an upper portion 202U of the inner volume 202 for spraying cleaning liquid or rinsing solution towards a substrate while the substrate is being transferred in and out the tank 201. In one embodiment, the cleaner module 200 comprises two front side spray bars 252, 253 disposed opposing the substrate support 213 and configured to delivery cleaning liquid or rinsing solution, and a back side spray bar 251 disposed in the same side as the substrate support 213. The front side spray bars 252, 253 are positioned at different vertical levels. Each spray bar 251, 252, 253 has a plurality of nozzles 251*a*, 252*a*, 253*a* directing towards a path of the substrate.

In one embodiment, the spray bars 251, 252 are connected to a DI water source and configured to spray DI water towards the substrate and the lower front side spray bar 253 is connected to a cleaning liquid source and configured to deliver a cleaning liquid.

FIGS. 5A-5E are schematic grafts showing a cleaning sequence using the cleaner modules 200 in accordance with one embodiment of the present invention.

Prior to cleaning a substrate, an exterior substrate handler, such as a robot, delivers the substrate to the substrate handler 240 in the exchanging position. While the substrate travels from the opening 203 of the tank 201 towards the substrate handler 240 at the lower portion 202L, the spray bars 251, 252, 253 direct DI water and cleaning liquid to the substrate. In one embodiment, the spray bars 251, 252 each deliver DI water at a flow rate between about 0.5 L/min to about 3.6 L/min, and the spray bar 253 delivers a clean liquid at a flow rate between about 0.5 L/min to about 3.6 L/min. In one embodiment, the spray bars 251, 252, 253 deliver rinsing solution and cleaning liquid in the same manner when the substrate is being transferred out of the tank 201 after cleaned by the disk brush 221.

The substrate handler 240 then moves to the loading position to load the substrate on the substrate support 213. A vacuum is applied to chuck the substrate on the substrate support 213. The substrate handler 240 then moves away from the loading position, either to the exchanging position or a separate standby position so that the substrate support 213 can rotate the substrate without touching the substrate handler 240.

The disk brush 221 is positioned away from the substrate near a center region of the substrate support 213. The brush depth control assembly 231 then works to push the disk brush 221 against the substrate on the substrate support 213. This can be achieved by controlling the force between the substrate and the disk brush 221 using the cylinder 232 only, or by controlling the gap between the substrate and the disk brush 221 using the motor 233 and the cylinder 232 together.

Figure 5A:
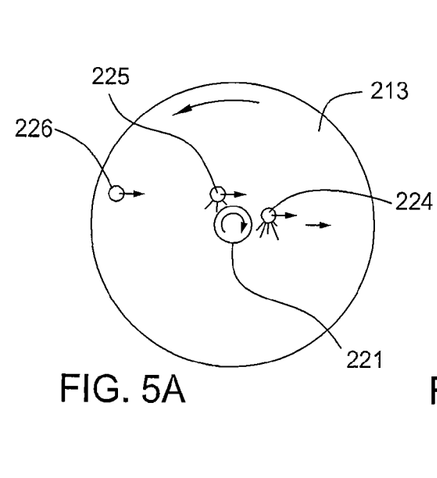
FIGS. 5A-5E are schematic grafts showing a cleaning sequence using the cleaner module in accordance with one embodiment of the present invention.

After the disk brush 221 is pushed against the substrate, the cleaning process may be started. At the beginning, the spray nozzle 224 delivers a cleaning liquid towards the substrate, the fluid jet 225 positioned near the disk brush 221 delivers a cleaning liquid towards the substrate, and the fluid jet 226 positioned away from the disk brush 221 is idle as shown in FIG. 5A.

Figure 5B:
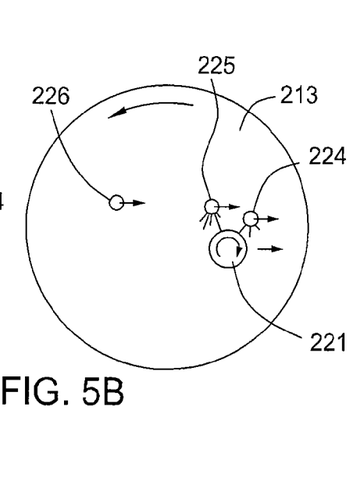

The substrate support 213 then rotates the substrate, and the disk brush 221 rotates at an opposite direction as the substrate support 213, while the disk brush 221 is pressed against the substrate and moves radially outwards from the central region of the substrate 205 to the edge region of the substrate as shown in FIG. 5B until the disk brush 221 passes the edge of substrate. In one embodiment, the disk brush 221 presses the substrate 205 at a force between about 0.1 lb to about 0.5 lb during cleaning. In one embodiment, the substrate rotation rate is about 100 RPM to about 400 RPM. The rotation rate of the disk brush 221 may be about the 100 RPM to about 400 RPM. The linear speed of the disk brush 221 is between about 0.8 inch/second to about 6 inch/second during cleaning as the disk brush 221 moves from the center of the substrate to the edge of the substrate 205.

The spray nozzle 224, the fluid jets 225, 226 moves with the disk brush 221. The spray nozzle 224 is positioned to wet the region on the substrate prior to the arrival of the disk brush 221. In one embodiment, the spray nozzle 224 delivers a cone shaped or fan shaped flow of the cleaning liquid at a flow rate between about 50 mil/min to about 500 ml/min. In one embodiment, the fluid jet 225 sprays atomized flow of the cleaning liquid towards the substrate at a flow rate between about 20 ml/min to about 100 ml/min with nitrogen gas at pressure of up to 40 psi.

Figure 5C:
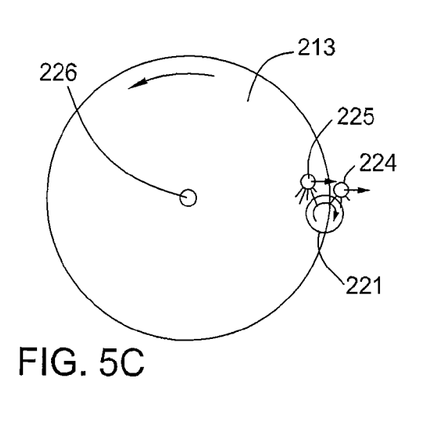

As shown in FIG. 5C, the rotating disk brush 221 is pressed against the substrate and moves radially out towards and passes the edge of the substrate.

Figure 5D:
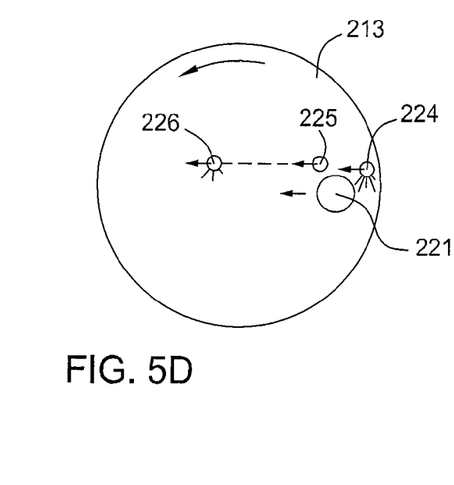

The disk brush 221 is then moved away from the substrate and the disk brush 221 and fluid nozzles are moved back to the original location, as shown in FIG. 5D. While moving back, the fluid jet 225 near the disk brush 221 stays idle, and the fluid jet 226 away from the disk brush 221 directs an atomized fluid flow towards the substrate as the fluid jet 226 moves from a center region of the substrate to the edge region of the substrate, and the substrate support 213 rotates the substrate continuously. The fluid jet 226 delivers the atomic fluid flow to clean and wet the substrate and condition the substrate with charge. In one embodiment, the spray nozzle 224 may direct a rinse fluid, such as DI water, towards the disk brush 221 to rinse and clean the disk brush 221. In one embodiment, the linear speed of the disk brush 221 is about 6 inch/second during the return from the substrate edge towards the center as shown in FIG. 5e.

During the cleaning sequence shown in FIGS. 5A-5E, the substrate being processed is rotated continuously by the substrate support 213.

Figure 5E:
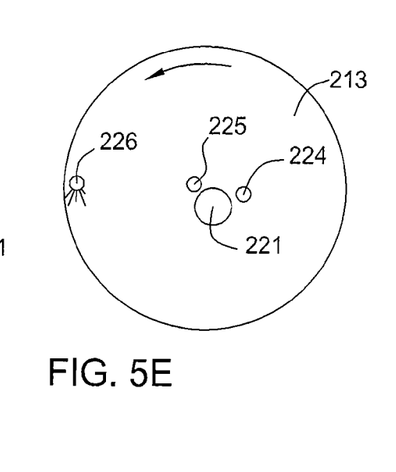

As shown in FIG. 5E, the disk brush 221, the spray nozzle 224, and the fluid jets 225, 226 moves back to the original location, thus a cleaning cycle is completed. In one embodiment, the cleaning cycle shown in FIGS. 5A-5E may be repeated multiple times for each substrate.

After cleaning process is completed, the substrate handler 240 moves back to the loading location to pick up the substrate from the substrate support 213. The substrate handler 240 then moves back to the exchange location so that an exterior handler can pick up the substrate.

Figure 8:
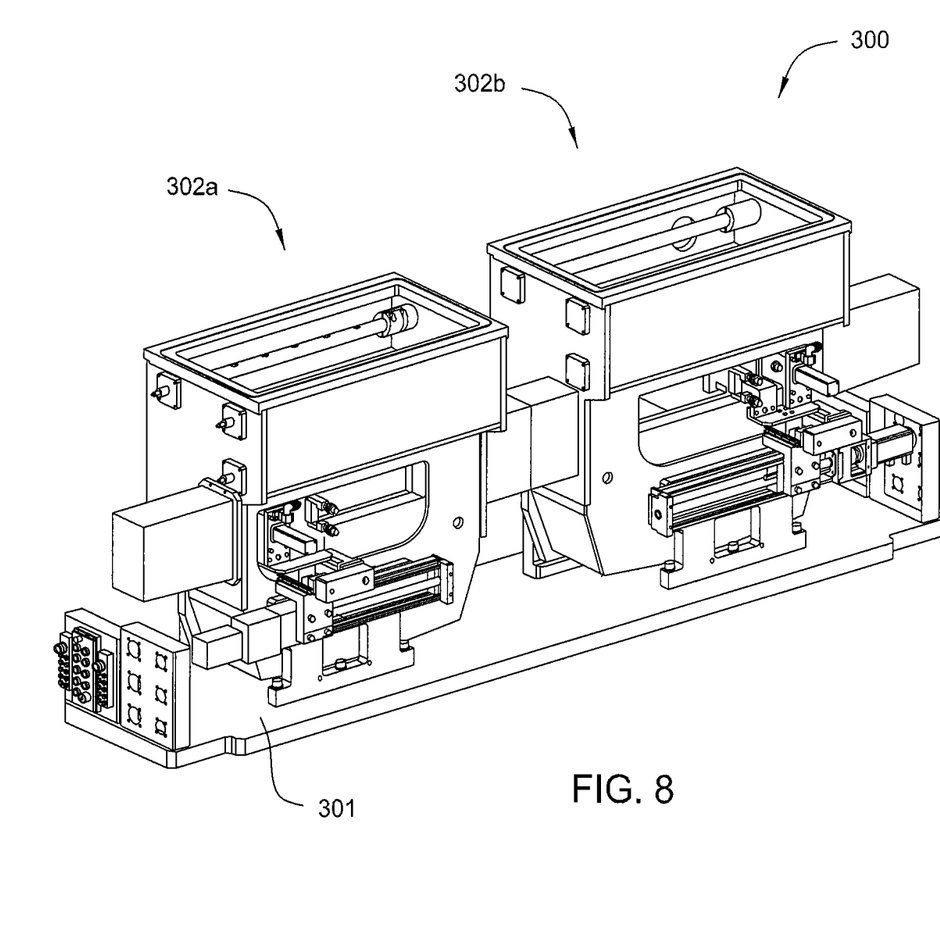
FIG. 8 is a schematic perspective view of a paired cleaner module in accordance with one embodiment of the present invention.

The cleaner module 200 may operate as a stand alone module. Two cleaner modules can form a paired cleaner module in a system. FIG. 8 is a schematic perspective view of a paired cleaner module 300 in accordance with one embodiment of the present invention.

The paired cleaner module 300 comprises two cleaner modules 302a, 302b secured on a supporting frame 301. Each cleaner module 302a, 303b is configured to receive and clean a substrate in a vertical orientation using a disk brush. The cleaner module 302a and 302b are similar to the cleaner module 200 described above. In one embodiment, the structures of cleaner modules 302a, 302b have mirror images of one another to minimize the footprint.

One or more cleaner modules 300 may be used in a system configured to clean two substrates in a parallel manner.

Figure 9:
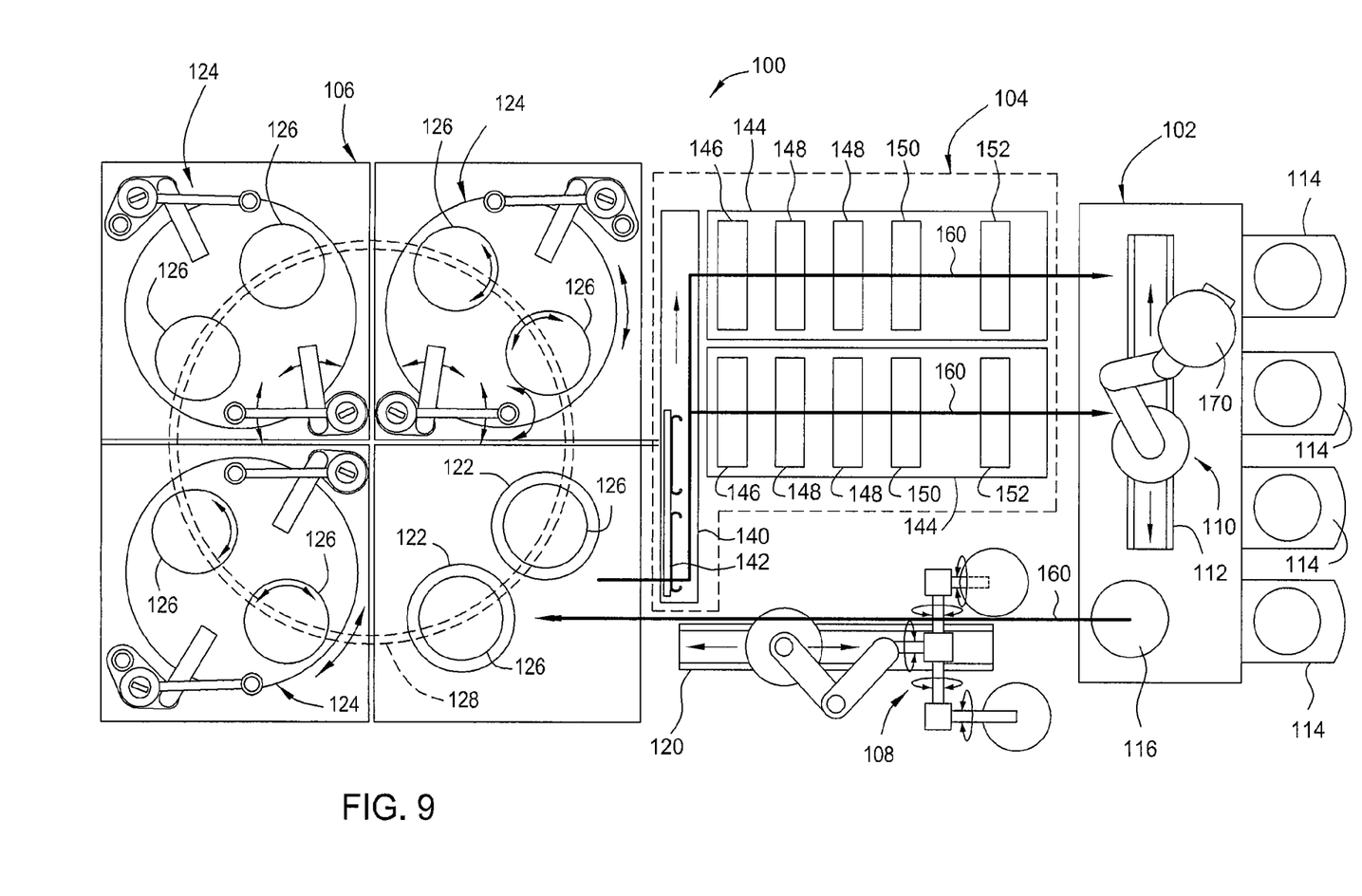
FIG. 9 is a schematic plan view of a polishing system having a cleaner module in accordance with one embodiment of the present invention.

FIG. 9 is a schematic plan view of a polishing system 100 in accordance with one embodiment of the present invention. The polishing system 100 generally includes a factory interface 102, a cleaner module 104 and a polishing module 106. A wet robot 108 is provided to transfer substrates 170 between the factory interface 102 and the polishing module 106. The wet robot 108 may also be configured to transfer substrates between the polishing module 106 and the cleaner module 104. In one mode of operation, the flow of substrates, such as semiconductor wafers or other work piece, through the polishing system 100 is indicated by arrows 160.

The factory interface 102 generally includes a dry robot 110 which is configured to transfer substrates 170 among one or more cassettes 114 and one or more transfer platforms 116. In one embodiment, the dry robot 110 is mounted on a track 112.

The wet robot 108 generally is configured to retrieve the substrates 170 from the factory interface 102 in a face-up horizontal orientation, to flip the substrates 170 to a face-down horizontal orientation to the polishing module 106, and to rotate the substrates 170 to a vertical orientation to the cleaner module 104. In one embodiment, the wet robot 108 is mounted on a track 120 and facilitates linear translation of the wet robot 108.

The polishing module 106 generally comprises a plurality of polishing heads 126 configured to retain substrates 170, load cups 122 configured to receive the substrates 170 from the wet robot 108 and transfer the substrates 170 to the polishing heads 126, and two or more polishing stations 124 configured to polish the substrates 170 on the polishing heads 126.

In one embodiment, the polishing heads 126 are coupled to an overhead track 128. The overhead track 128 is configured to transfer the polishing heads 126 and to position the polishing heads 126 selectively over the polishing stations 124 and load cups 122. In the embodiment, the overhead track 128 has a circular configuration which allows the polishing heads 126 to be selectively rotated over and/or clear of the load cups 122 and the polishing stations 124. It is contemplated that the overhead track 128 may have other configurations including elliptical, oval, linear or other suitable orientation.

During processing, the substrates 170 are transferred from the cassette 114 to the transfer platform 116 by the dry robot 110. The substrates 170 are then picked up by the wet robot 108 and transferred to the load cups 122. Returning to FIG. 1, processed substrates are returned to the load cups 122 of the polishing module 106 for transfer by the wet robot 108 to the cleaner module 104. The cleaner module 104 generally includes a shuttle 140 and one or more cleaning modules 144. The shuttle 140 includes a transfer mechanism 142 which facilitates hand-off of the processed substrates from the wet robot 108 to the one or more cleaning modules 144.

The processed substrates are transferred from the shuttle 140 through of the one or more cleaning modules 144 by an overhead transfer mechanism (not shown). In the embodiment depicted in FIG. 1, two cleaning modules 144 are shown in an aligned, parallel arrangement. Each of the cleaning modules 144 generally include one or more megasonic cleaners, one or more brush boxes, one or more spray jet boxes and one or more dryers. In the embodiment depicted in FIG. 1, each of the cleaning modules 144 includes a megasonic cleaner module 146, two brush box modules 148, a jet cleaner module 150 and a dryer 152. Dried substrates leaving the dryer 152 are rotated to a horizontal orientation for retrieval by the dry robot 110 which returns the dried substrates 170 to an empty slot in one of the wafer storage cassettes 114.

In one embodiment, a transfer device (not shown) is used to retrieve and advance substrates 170 through the cleaning module 144 sequentially, from the megasonic cleaner module 146 to the brush box module 148 then to the jet cleaner module 150 and the dryer 152. Each module 146, 148, 150 focuses on a different cleaning function to achieve a desired cleaning effect.

The megasonic cleaner module 146 is configured to perform an efficient cleaning step using megasonic energy. The jet cleaner module 150 is configured to perform a cleaning step using pressurized liquid. The dryer 152 is configured to quickly dry a substrate after cleaning to remove bath residue and prevent streaking and spotting caused by evaporation.

The brush box module 148 is configured to perform a cleaning step using mechanical contact, such as scrubbing motion. Embodiments of cleaner modules are also described with FIGS. 1-4 and 6-8 of the present application.

While the foregoing is directed to embodiments of the present invention, other and further embodiments of the invention may be devised without departing from the basic scope thereof, and the scope thereof is determined by the claims that follow.

What is claimed is:

1. A substrate cleaner, comprising:
  a chamber body defining a processing volume, wherein the chamber body has a top opening configured to allow passage of a substrate;
  a vacuum chuck disposed in the processing volume, wherein the vacuum chuck contacts a back surface of a substrate to secure the substrate and rotate the substrate in a substantially vertical orientation about a central axis of the vacuum chuck; and
  a brush assembly disposed in the processing volume, wherein the brush assembly comprises:
    a disk brush movably disposed opposing the vacuum chuck, wherein the disk brush has a substantially planar processing surface facing the vacuum chuck for contacting and cleaning a front surface of the substrate.

2. The substrate cleaner of claim 1, further comprising:
  a substrate holder assembly disposed in the processing volume, wherein the substrate holder is configured to transfer substrates between the vacuum chuck and an exterior substrate handler.

3. The substrate cleaner of claim 2, further comprising:
  at least two spray bars disposed in the processing volume above the brush assembly, wherein each spray bar has a plurality of nozzles configured to spray fluid towards a front side or a back side of the substrate being processed.

4. The substrate cleaner of claim 2, wherein the substrate holder comprises:

an end effector having two or more notches to receive and support a substrate at a substantially vertical orientation by an edge region of the substrate;
a horizontal motion assembly configured to move the end effector horizontally; and
a vertical motion assembly configured to move the end effector vertically.

5. The substrate cleaner of claim 4, wherein the substrate holder further comprises a sensor assembly positioned to detect the presence of a substrate on the end effector.

6. The substrate cleaner of claim 1, wherein the brush assembly further comprises:
a disk brush sliding assembly configured to move the disk brush parallel to the vacuum chuck and across a radius of the vacuum chuck; and
a disk brush motor configured to rotate the disk brush about a central axis of the substantially planar processing surface of the disk brush.

7. The substrate cleaner of claim 6, wherein the brush assembly further comprises:
a disk brush spray nozzle coupled to the disk brush sliding assembly near the disk brush, the disk brush spray nozzle configured to spray a fluid to wet a substrate on the vacuum chuck and to clean the disk brush.

8. The substrate cleaner of claim 6, wherein the brush assembly further comprises:
a brush depth control assembly configured to pressure the disk brush against a substrate on the vacuum chuck.

9. The substrate cleaner of claim 8, wherein the brush depth control assembly comprises a cylinder configured to move the disk brush towards and away from the vacuum chuck, wherein the cylinder is controlled by a regulator to stop the cylinder when a predetermined pressure is applied to the substrate on the vacuum chuck by the disk brush.

10. The substrate cleaner of claim 8, wherein the brush depth control assembly comprises:
a gap control motor configured to move the disk brush towards the vacuum chuck, wherein a torque of the gap control motor is monitored to detect a contact point at which the disk brush contacts the substrate; and
a cylinder configured to move the disk brush to the contact point for cleaning and back from the contact point after cleaning.

11. The substrate cleaner of claim 6, further comprising:
a first fluid jet coupled to the disk sliding assembly; and
a second fluid jet coupled to the disk sliding assembly, wherein the first fluid jet is positioned near the disk brush, the second fluid jet is positioned away from the disk brush at a distance about a radius of the substrate being processed, and the first and second fluid jet are configured to direct atomized processing fluid toward the substrate being processed.

12. The substrate cleaner of claim 1, wherein the vacuum chuck comprises:
a disk shaped supporting body having an upper surface;
a lip extending from an edge region of the upper surface, wherein the lip contacts the back surface of the substrate during processing, and a pocket is formed between the upper surface and the back surface of the substrate within the lip.

13. A substrate cleaner, comprising:
a tank having an upper opening and an inner volume for accommodating a substrate in a substantially vertical direction;
a vacuum chuck disposed in the inner volume, wherein the vacuum chuck contacts a back surface of a substrate to secure the substrate and rotate the substrate in a substantially vertical orientation about a central axis of the vacuum chuck;
a substrate handler disposed in a lower portion of the inner volume, wherein the substrate handler is configured to transfer a substrate between the vacuum chuck and an exterior robot; and
a brush assembly comprising:
a disk brush movably disposed in the inner volume opposing the substrate chuck, wherein the disk brush has a substantially planar processing surface for contacting and cleaning a substrate on the vacuum chuck;
a sliding mechanism configured to slide the disk brush parallel to the vacuum chuck between a central region of the vacuum chuck and an edge region of the vacuum chuck;
a spray nozzle coupled to the sliding mechanism near the disk brush, wherein the spray nozzle directs a processing fluid towards a substrate on the vacuum chuck and the disk brush;
a rotating motor configured to rotate the disk brush about a central axis of the substantially planar processing surface; and
a cylinder configured to move the substantially planar processing surface of the disk brush towards and away from the vacuum chuck.

14. The substrate cleaner of claim 13, wherein the brush assembly further comprises:
a first fluid jet coupled to the sliding mechanism, wherein the first fluid jet is configured to direct atomized processing fluid toward the substrate on the vacuum chuck.

15. The substrate cleaner of claim 14, wherein the brush assembly further comprises a second fluid jet coupled to the sliding mechanism, wherein the second fluid jet is configured to direct atomized processing fluid toward the substrate on the vacuum chuck, the first fluid jet is positioned near the disk brush and the second fluid jet is positioned away from the disk brush at a distance about a radius of the vacuum chuck.

16. The substrate cleaner of claim 13, further comprising:
two front side spray bars disposed in an upper portion of the inner volume, wherein each front side spray bar has a plurality of nozzles facing the vacuum chuck and configured to spray fluid; and
a back side spray bar disposed in the upper portion of the inner volume, wherein the back side spray bar is positioned on an opposite side of the two front side spray bars, and the back side spray bar has a plurality of nozzles.

17. The substrate cleaner of claim 13, wherein the brush assembly further comprises a gap control motor configured to move the disk brush towards the vacuum chuck, and a torque of the gap control motor is monitored to detect a contact point at which the disk brush contacts a substrate on the vacuum chuck.

18. The substrate cleaner of claim 13, wherein the vacuum chuck comprises:
a disk shaped supporting body having an upper surface;
a lip extending from an edge region of the upper surface, wherein the lip contacts the back surface of the substrate during processing, a pocket is formed between the upper surface and the back surface of the substrate within the lip, and the disk shaped supporting body has a fluid channel connecting the pocket to a vacuum source to facilitate vacuum chuck of the substrate.

19. The substrate cleaner of claim 13, wherein the substrate holder comprises:
- an end effector having two or more notches to receive and support a substrate at a substantially vertical orientation by an edge region of the substrate;
- a horizontal motion assembly configured to move the end effector horizontally; and
- a vertical motion assembly configured to move the end effector vertically.

* * * * *